United States Patent [19]

Baldwin

[11] Patent Number: 5,561,576

[45] Date of Patent: Oct. 1, 1996

[54] STEP DOWN TRANSFORMER POWER SUPPLY WITH SHORT CIRCUIT PROTECTION

[75] Inventor: John R. Baldwin, Newtown, Conn.

[73] Assignee: Hubbell Incorporated, Orange, Conn.

[21] Appl. No.: 409,593

[22] Filed: Mar. 24, 1995

[51] Int. Cl.$^6$ ........................................................ H02H 7/04
[52] U.S. Cl. .............................................. 361/41; 361/104
[58] Field of Search .......................... 361/18, 35, 37–39, 361/41, 103–104; 336/192, 179–180; 323/268, 273, 246, 274–278, 284–285; 363/53, 86

[56] References Cited

U.S. PATENT DOCUMENTS

| | | | |
|---|---|---|---|
| 3,691,425 | 9/1972 | Weyrich et al. | 361/41 |
| 4,175,250 | 11/1979 | Morgan | 323/268 |
| 4,855,892 | 8/1989 | Lower | 363/86 |

Primary Examiner—Jeffrey A. Gaffin
Assistant Examiner—Michael J. Sherry
Attorney, Agent, or Firm—Jerry M. Presson; William C. Roch

[57] ABSTRACT

A step down transformer power supply with short circuit protection which uses a minimal size transformer, as opposed to an energy limiting transformer. The transformer is mounted directly on a PC board without additional mounting hardware, and has a fuse in its secondary winding, which is required to pass a UL short circuit test, and is normally nonreplaceable. A low cost circuit limits the current output of the transformer such that the fuse is not blown, even under a shorted output condition, which would normally require replacement of the transformer. A rectifier circuit is coupled across the secondary winding of the step down transformer, and is coupled to a first terminal of a three terminal power regulator circuit which supplies a regulated stepped down voltage through a second terminal connected to a load. The third terminal thereof comprises a current/voltage limiting control terminal. A resistor is coupled in series with the load to sense the output current through the load, and is connected to the base of a transistor having an emitter, collector, and base. The collector and emitter of the transistor are coupled in series with the control terminal of the power regulator circuit, such that as the output current increases above a threshold indicative of a short, the output current of the power regulator is limited to prevent the slow-blow fuse from being blown.

18 Claims, 2 Drawing Sheets

STEP DOWN TRANSFORMER POWER SUPPLY WITH SHORT CIRCUIT PROTECTION

BACKGROUND OF THE INVENTION

1. Field of the Invention

The present invention relates generally to a step down transformer power supply circuit with short circuit protection for the transformer. More particularly, the subject invention pertains to such a step down transformer power supply circuit which uses a minimal size transformer, as opposed to a heavier and more expensive energy limiting transformer. The transformer secondary winding has a slow-blow fuse, which is normally nonreplaceable, to meet UL requirements, and a low cost circuit is provided to limit the current output of the transformer such that the slow-blow fuse is never blown, which would normally require replacement of the transformer.

BACKGROUND OF THE INVENTION

Bryant Control Models CM120/277 and CM347 are circuits designed to supply a +12 VDC power output for passive infrared detectors such as ceiling mount sensors, wall mount sensors and photocell ceiling mount (PCCM) sensors, and also to provide relay switching for appliances such as lights controlled by such sensors. If the +12 VDC output of these circuits is shorted to ground for only a few seconds, a nonreplaceable slow-blow fuse in a step down transformer therein will blow open and when that happens the entire transformer must be replaced.

Bryant Control Modules, CM120/277 and CM347 are designed to meet Underwriters Laboratory (UL) and Canadian Standards Association (CSA) safety requirements. A tapped line voltage transformer is used to step down the input voltage in both models. The tapped line voltage transformer in the CM120/277 allows an installer to select an appropriate tap for either 120 VAC or 277 VAC operation. The transformer is the most expensive part in each model. To meet UL requirements, the transformer must be protected against failure modes which could result in a hazard or in damage to property.

Typically the transformer is protected against a shorted secondary output either by a fuse or by an energy limiting construction which avoids unacceptable temperature buildup under a shorted output condition. A continuously shorted energy limiting transformer will get very hot and eventually will suffer irreparable damage. An energy limiting construction results in a significant increase in cost as well as a significant increase in size and weight. This increased size and weight results in less volume available for wiring, etc. inside the enclosure, and a possible requirement for additional PC board space, with resultant increased costs. Moreover, a significant increase in the size and weight of an energy limited, PC board mounted transformer will greatly increase the incidence of units damaged in shipping, or result in added costs to mechanically fasten the transformer to the PC board.

SUMMARY OF THE INVENTION

Accordingly, it is a primary object of the present invention to provide a step down transformer power supply with short circuit protection which uses a minimal size transformer, as opposed to an energy limiting transformer. The transformer is mounted directly on a PC board without additional mounting hardware, and has a fuse in the secondary winding which is required to pass a UL short circuit test for the transformer, and is normally nonreplaceable. The present invention provides a low cost circuit which limits the current output of the transformer such that the fuse is not blown, even under a shorted output condition. The extra circuitry required by the present invention entails four additional resistors (R18, R19, R20, R21) and a signal transistor (Q5), adding approximately only $ 0.09 worth of additional parts.

The design of the present invention permits use of a low cost, three terminal voltage regulator instead of a more expensive voltage regulator with fold-back current limiting (having a triangular voltage drop versus current characteristic) and an external regulator transistor. The design keeps the junction temperature of the regulator below 90 degrees Centigrade for reliable operation even with the worst case of continuous abnormal output conditions, such as a direct short.

In accordance with the teachings herein, the present invention provides a step down regulated power supply circuit having output short circuit protection. The circuit includes a step down transformer having a primary winding connected to an AC power supply and a secondary winding for supplying a stepped down voltage. A slow-blow fuse is connected in the secondary winding. A rectifier circuit is coupled across the secondary winding, and is coupled to a first terminal of a three terminal power regulator circuit which supplies a regulated stepped down voltage through a second terminal connected to a load. The third terminal thereof comprises a current/voltage limiting control terminal. A resistor is coupled in series with the load to sense the output current through the load, and is connected to the base of a transistor having an emitter, collector, and base. The collector and emitter of the transistor are coupled in series with the control terminal of the power regulator circuit, such that as the output current increases above a threshold indicative of a short, the output current of the power regulator is limited to prevent the slow-blow fuse from being blown.

In greater detail, the transformer comprises a minimal size transformer, not an energy limiting transformer, and is mounted directly on a printed circuit board. The slow-blow fuse is a nonreplaceable fuse. Second and third resistors are coupled in series between the second terminal of the power regulator circuit and ground, with the series connection between the second and third resistors being coupled to the transistor collector and also to the third control terminal of the power regulation circuit, to bias the power regulator circuit to produce a given regulated DC voltage output. A fourth resistor is coupled in series with the first resistor and ground, and the series connection between the first and fourth resistors is coupled to the transistor base to hold the collector to emitter voltage of the transistor above a reasonable value permitting linear operation of the transistor. The transistor is an npn transistor and comprises a PN2222A transistor or equivalents such as 2N3903 and MPSA20. The voltage regulator circuit comprises an integrated circuit which produces a regulated 12 VDC output, and comprises an LM317T circuit or equivalents such as LM150, LM250, LM350, LM117, LM217, LM138, LM338.

BRIEF DESCRIPTION OF THE DRAWINGS

The foregoing objects and advantages of the present invention for a step down transformer power supply circuit with short circuit protection may be more readily understood by one skilled in the art with reference being had to the following detailed description of a preferred embodiment thereof, taken in conjunction with the accompanying drawings wherein.

DETAILED DESCRIPTION OF THE DRAWINGS

Figure 1:
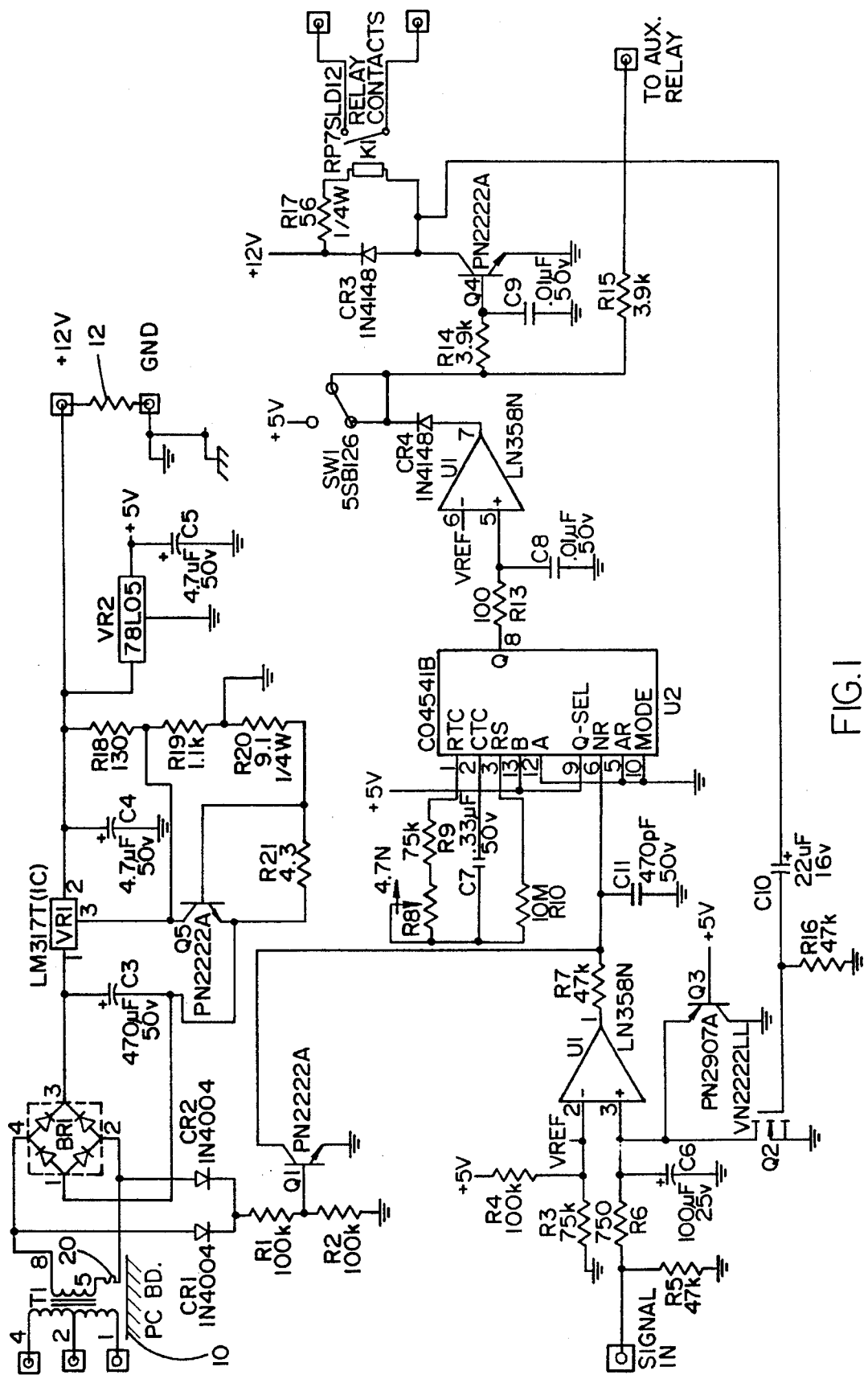
FIG. 1 is an electrical schematic of a step down transformer power supply circuit with short circuit protection which incorporates therein the protective circuit of the present invention.

Referring to the drawings in detail, FIG. 1 is an electrical schematic of a step down transformer T1 power supply circuit with short circuit protection which incorporates therein the protective circuit of the present invention. The circuit is designed to supply a +12 VDC power output for passive infrared detectors such as ceiling mount sensors, wall mount sensors and photocell ceiling mount (PCCM) sensors, and also to provide relay switching for appliances such as lights controlled by such sensors. The circuit is an energy management product, and is designed, for example, to turn the lights in a room on in response to the detection of a person in the room and to turn the lights off if the presence of a person is not detected for a given period of time, such as, for example, ½ minute to 30 minutes.

The circuit receives input signals at SIGNAL IN from sensors such as passive IR motion sensors, and in response thereto supplies power through an output relay K1 to room lights, etc. An input signal might be produced and received from any one of a number of passive IR motion sensors, and is amplified by a threshold amplifier U1 when it exceeds a set threshold amplitude. The output of threshold amplifier U1 triggers a timer chip U2, which produces an output signal to energize the output relay K1 for a given period of time, typically ½ minute to 30 minutes. The relay will be deenergized after expiration of the time period if a further input signal is not received to restart the timer U2. A person present in the room will produce numerous input signals from the passive IR sensors, and each input signal will retrigger the timer to maintain the lights on until the person leaves the room, after which no further input signals will be received to allow the timer to time out and turn off the lights.

The output power relay K1 is desirably turned on and off while the AC power thereto is near a zero crossing to prevent arcing across the relay contacts and extend the life of the relay. For a typical AC power supply, a 400 μsec window exists around each zero crossing every one half cycle to turn the relay on or off to extend the life thereof. Moreover, after the relay receives a signal to turn on or off, it takes a finite time for the relay to react thereto and change states. That finite time might typically be in the range of ¼ power cycle (4.2 millisec) to 1 power cycle (16.7 millisec), and depends upon the particular relay K1. A delay circuit comprising the combination of resistor R13 and capacitor C8 provides a controllable time delay, which is selected to match the finite reaction time of the particular relay K1, such that the relay K1 turns on or off during a subsequent zero crossing window. For example, when the timer U2 is initially turned on in response to a sensor input, capacitor C8 charges towards VREF, present at pin 6 of U1, and after the timed delay, pin 7 of U1 goes high and turns on a driver transistor Q4 to energize relay K1 and turn on the lights during a zero crossing window.

The timing for the zero crossing passages is provided by transistor Q1. Transistor Q1 samples the AC power output across the secondary of step down transformer T1 through diodes CR1 and CR2, and provides the zero crossover timing for the circuit. Transistor Q1 turns on within 1.2 V of a zero crossover, and when on maintains the output of threshold amplifier U1 at zero volts. As a consequence thereof, threshold amplifier U1 can trigger timer U2 only when Q1 is off, which is near the zero crossovers.

Transistor Q3 is provided for power outages lasting only seconds, during which capacitor C6 would normally retain a charge, and is provided to discharge capacitor C6 to allow the circuit to recycle.

Insulated gate transistor Q2 and the time delay provided by resistor R16 and capacitor C10 are provided to inhibit input signals at SIGNAL IN for a given time period, such as one to two seconds, during transients, such as when the lights in the room are first turned on or off, to stabilize operation of the circuit.

Switch SW1 is a test switch to provide +5V to energize driver transistor Q4 and relay K1 during testing procedures.

A second output (TO AUX.RELAY) is provided which can be connected to another circuit like R14, C9, Q4, etc. to energize a second power relay, if required by the application.

Figure 2:
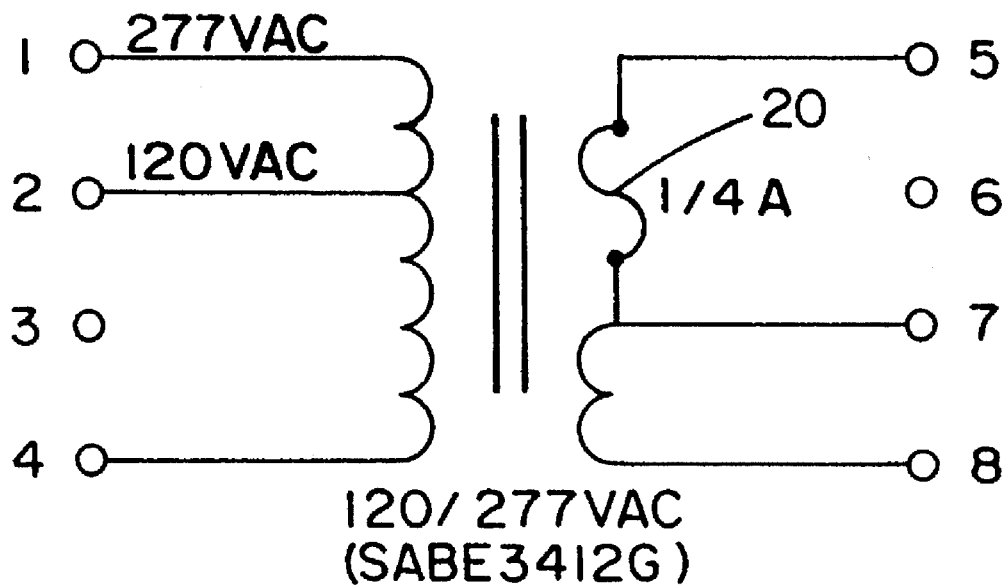
FIG. 2 illustrates several types of transformer connections that can be used with the circuit of FIG. 1, for various AC voltage supplies such as 120 VAC, 277 VAC and 347 VAC.
Figure 2:
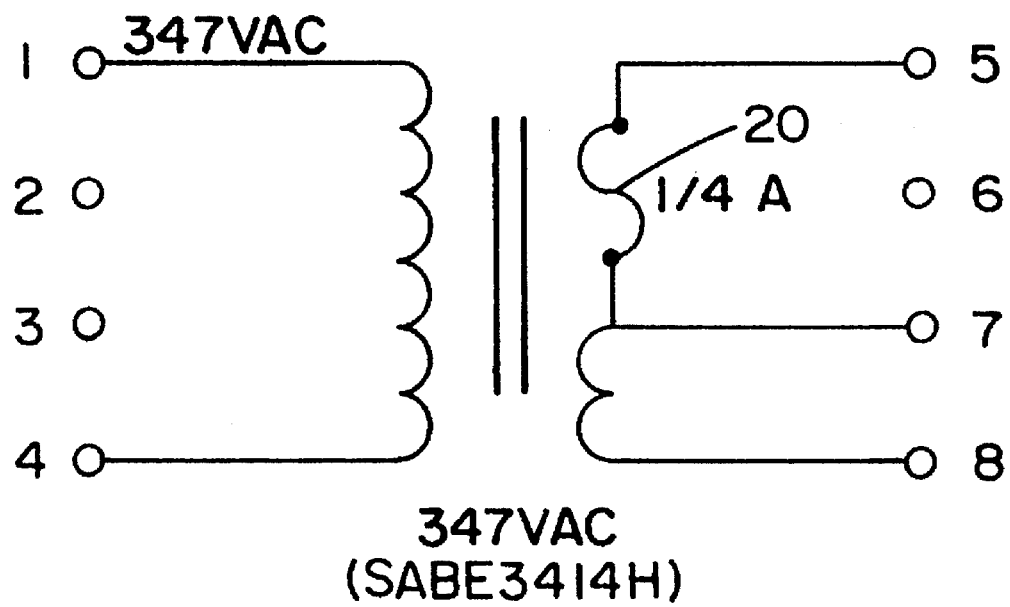

FIG. 2 illustrates several possible transformer connections for different AC power supplies: upper illustration, tap 1 (and 4) for 277 VAC; upper illustration, tap 2 (and 4) for 120 VAC; lower illustration of a second transformer for 347 VAC. FIGS. 1 and 2 illustrate a 0.25 amp slow-blow fuse 20 connected in the secondary of each transformer. The 250 milliampere fuse is provided to meet UL requirements for protection against failure modes which could result in a hazard or damage to property. The slow-blow fuse is normally nonreplaceable, and if it is blown open the transformer must be replaced. In some embodiments, the slow-blow fuse could be designed to be replaceable, but that would result in a more expensive design. The transformer is the most expensive component of the circuit of FIG. 1, and accordingly the present invention provides a low cost protective circuit which limits the current output of the transformer such that the fuse is not blown, even under a shorted output condition.

Power (+12 V) is supplied to the passive IR motion sensors by an input step down transformer T1, the secondary winding of which is connected to a typical diode bridge circuit BR1, the output of which is coupled to a voltage regulator chip VR1 which supplies a regulated +12 V output. The voltage regulator chip VRl can be an integrated circuit (IC) as illustrated in FIG. 1, such as an LM317T circuit or equivalent. The input step down transformer T1 is mounted directly on a PC (printed circuit) board 10, which is illustrated schematically in FIG. 1. A second voltage regulator chip VR2 is coupled to the regulated +12 V output, and supplies regulated +5 V output to those components requiring it, such as U2.

The +12 V regulated output of VR1 is produced across the terminals at the right thereof marked +12 V and GND, which is normally coupled to the passive IR sensors. The present invention is concerned with a short across the +12 V and GND terminals, as might be caused by a careless installer, or a careless workman working around the installation. Without the installation of the protective circuit of the present invention, the bottom of capacitor C3 would be connected to ground, and transistor Q5 and resistors R18, R19, R20 and R21 would be omitted, or depending upon the particular voltage regulator VR1, bias resistors R18 and R19 might be present.

With the circuit of the present invention, a load 12 across +12 V and GND (such as a short) causes current to flow from pin 3 of bridge BR1, through VR1, 12 V, across the load to GND, R20, R21, to pin 1 of bridge BR1.

The current through R21 turns Q5 on, which controls voltage regulator VR1 through pin 3 to limit the current output of voltage regulator VR1. Resistors R18, R19 normally bias VR1 for a +12 VDC output. Transistor Q5 is OFF until the total load current (onboard and external) rises to approximately 120 milliamperes through R21, which begins to turn Q5 ON. As Q5 enters the active region, the output voltage of VR1 drops below +12 VDC by an amount sufficient to limit the total load current to a maximum of approximately 150 milliamperes even when the output is completely shorted. The resistor R20 functions to hold Q5 $V_{ce}$, >1.0 volts in order to maintain linear operation of Q5 under abnormal low output voltage conditions. The 150 milliamperes maximum is well below the 250 milliampere transformer secondary fuse value, and therefor even a complete short condition will not blow the transformer fuse.

While several embodiments and variations of the present invention for a step down transformer power supply with short circuit protection are described in detail herein, it should be apparent that the disclosure and teachings of the present invention will suggest many alternative designs to those skilled in the art.

What is claimed is:

1. A step down regulated power supply circuit having output short circuit protection, comprising:
   a. a step down transformer having a primary winding connected to an AC power supply and a secondary winding for supplying a stepped down voltage, and a slow-blow fuse connected in the secondary winding;
   b. a rectifier circuit coupled across the secondary winding;
   c. a three terminal power regulator circuit for supplying a regulated stepped down voltage through a first terminal connected to the rectifier circuit and a second terminal connection to a load, and the third terminal comprising a current limiting control terminal;
   d. a first resistor coupled in series with the load to sense the output current through the load, and a transistor having an emitter, collector, and base, with the first resistor coupled to the base, and the collector and emitter coupled in series with the current limiting control terminal of the power regulator circuit, such that as the output current increases above a threshold indicative of a short, the output current of the power regulator is limited to prevent the slow-blow fuse from being blown.

2. A step down regulated power supply circuit as claimed in claim 1, wherein the slow-blow fuse is a nonreplaceable fuse, such that if the slow-blow fuse is blown, the transformer must be replaced.

3. A step down regulated power supply circuit as claimed in claim 1, wherein the transformer comprises a minimal size transformer, not an energy limiting transformer, and including a printed circuit board on which the transformer is directly mounted.

4. A step down regulated power supply circuit as claimed in claim 1, wherein a second resistor and a third resistor are coupled in series between the second terminal of the power regulator circuit and ground, with the series connection between the second and third resistors being coupled to the transistor collector and also to the third current limiting control terminal of the power regulation circuit, to bias the power regulator circuit to produce a given regulated DC voltage output.

5. A step down regulated power supply circuit as claimed in claim 1, wherein a fourth resistor is coupled in series with the first resistor and ground, and the series connection between the first and fourth resistors is coupled to the transistor base to hold the collector to emitter voltage of the transistor under a set value to maintain linear operation of the transistor.

6. A step down regulated power supply circuit as claimed in claim 1, wherein the transistor is an npn transistor.

7. A step down regulated power supply circuit as claimed in claim 6, wherein the transistor comprises a PN2222A transistor or equivalent.

8. A step down regulated power supply circuit as claimed in claim in claim 1, wherein the voltage regulator circuit produces a regulated 12 VDC output.

9. A step down regulated power supply circuit as claimed in claim 8, wherein the voltage regulator circuit comprises an integrated circuit.

10. A step down regulated power supply circuit as claimed in claim 9, wherein the voltage regulator circuit comprises an LM317T circuit or equivalent.

11. A step down regulated power supply circuit as claimed in claim 2, wherein the transformer comprises a minimal size transformer, not an energy limiting transformer, and including a printed circuit board on which the transformer is directly mounted.

12. A step down regulated power supply circuit as claimed in claim 11, wherein a second resistor and a third resistor are coupled in series between the second terminal of the power regulator circuit and ground, with the series connection between the second and third resistors being coupled to the transistor collector and also to the third current limiting control terminal of the power regulation circuit, to bias the power regulator circuit to produce a given regulated DC voltage output.

13. A step down regulated power supply circuit as claimed in claim 12, wherein a fourth resistor is coupled in series with the first resistor and ground, and the series connection between the first and fourth resistors is coupled to the transistor base to hold the collector to emitter voltage of the transistor under a set value to maintain linear operation of the transistor.

14. A step down regulated power supply circuit as claimed in claim in claim 13, wherein the voltage regulator circuit produces a regulated 12 VDC output.

15. A step down regulated power supply circuit as claimed in claim 14, wherein the voltage regulator circuit comprises an integrated circuit.

16. A step down regulated power supply circuit as claimed in claim 15, wherein the transistor is an npn transistor.

17. A step down regulated power supply circuit as claimed in claim 16, wherein the voltage regulator circuit comprises an LM317T circuit or equivalent.

18. A step down regulated power supply circuit as claimed in claim 17, wherein the transistor comprises a PN2222A transistor or equivalent.

* * * * *